United States Patent [19]

Wu

[11] Patent Number: 5,576,249
[45] Date of Patent: Nov. 19, 1996

[54] ELECTROCHEMICALLY ETCHED MULTILAYER SEMICONDUCTOR STRUCTURES

[75] Inventor: Wei-yu Wu, Calabasas, Calif.

[73] Assignee: Hughes Aircraft Company, Los Angeles, Calif.

[21] Appl. No.: 260,980

[22] Filed: Oct. 21, 1988

Related U.S. Application Data

[63] Continuation of Ser. No. 81,950, Aug. 5, 1987, abandoned.

[51] Int. Cl.$^6$ .......................... H01L 21/465; C03C 25/06
[52] U.S. Cl. ....................... 437/228; 156/647.1; 136/201
[58] Field of Search ........................ 156/647; 437/225, 437/228; 204/147; 136/201

[56] References Cited

U.S. PATENT DOCUMENTS

| | | | |
|---|---|---|---|
| 3,689,389 | 9/1972 | Waggener | 204/147 |
| 4,465,894 | 8/1984 | Reyes | 136/201 X |
| 4,795,498 | 1/1989 | Germanton et al. | 136/201 X |

OTHER PUBLICATIONS

G. H. Dohler et al., *In Situ Grown–In Selective Contact to N–i–p–i Doping*, App. Phys. Letters, vol. 49, pp. 704–706, Sep. 1986.

Horikoshi et al, *A New Doping Superlattice Photodetector*, Appl. Phys. Ab., vol. 37, pp. 47–56, 1985.

Faktor et al., *The Characterization of Semiconductor Materials & Structures Using Electrochemical Techniques*, North–Holland Publishing Co., 1980.

Primary Examiner—Peter A. Nelson
Attorney, Agent, or Firm—V. D. Duraiswamy; W. K. Denson-Low

[57] ABSTRACT

An electrochemical method is disclosed for selectively etching either n-type or p-type semiconductor material in the presence of the other type. A liquid electrolyte is prepared in which the etching reaction is based on hole transport. In selectively etching p-type material the holes are provided by the dopant concentration and the process is carried out in the dark to prevent the etching of n-type layers. Conversely, selective etching of n-type material is done in the presence of light and with p-type material effectively out of the current path. In a preferred embodiment of a method of selectively etching a doping superlattice n-i-p-i structure composed of alternating p-type and n-type GaAs layers, $C_6H_2(OH)_2(SO_3Na)_2 \cdot H_2O$ is used as the electrolyte. Selectively etching first the p-type layers at one end of the structure and then the n-type layers at the other end, digitate edge patterns are etched to which ohmic contacts can be applied. The invention also encompasses selectively etched structures which can be used to fabricate various kinds of electro-optic devices, such as optical modulators and photodetectors.

17 Claims, 2 Drawing Sheets

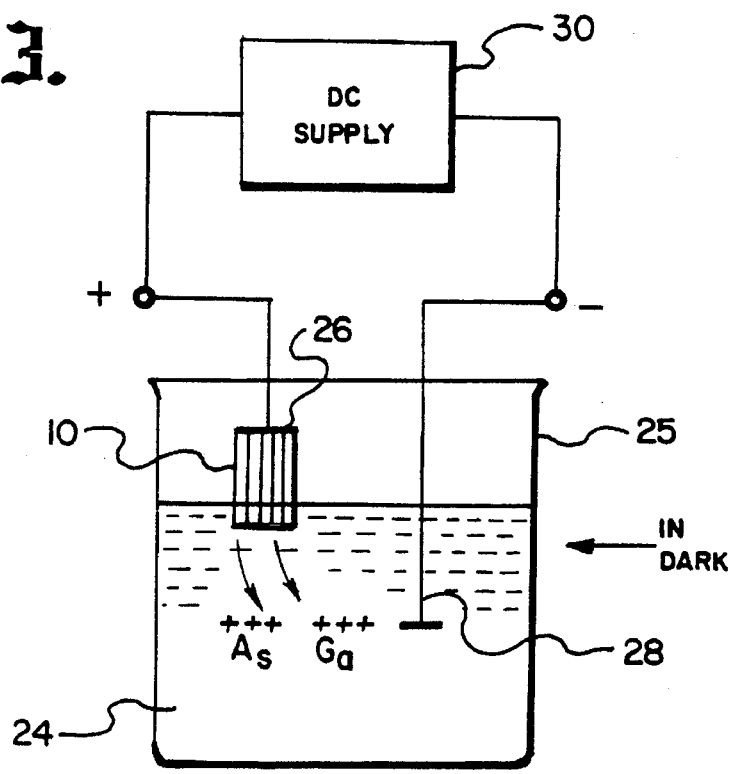
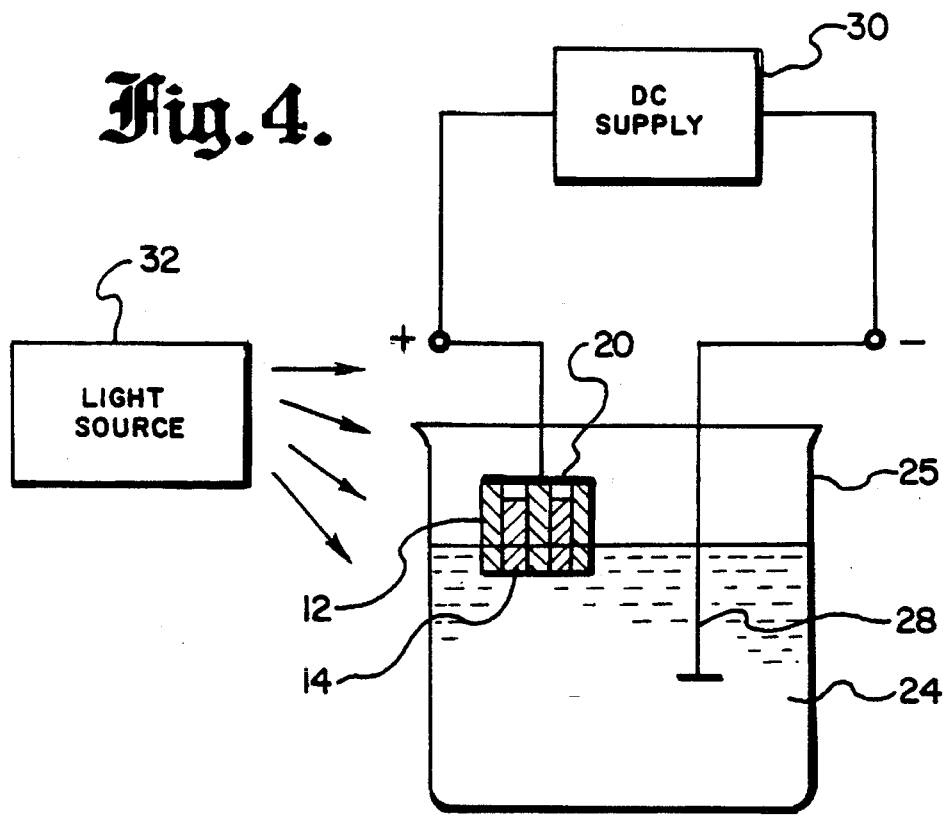

ELECTROCHEMICALLY ETCHED MULTILAYER SEMICONDUCTOR STRUCTURES

This is a continuation application of U.S. application Ser. No. 081,950, filed on Aug. 5, 1987, and assigned to the present assignee, Hughes Aircraft Company, and now abandoned.

BACKGROUND OF THE INVENTION

1. Government Rights in Invention

This invention was made with U.S. Government support under Contract No. F30602-86-C-0030, awarded by the Department of the Air Force. The U.S. Government has certain rights in this invention.

2. Field of the Invention

This invention relates to methods for etching p-type or n-type doped semiconductor material, and more particularly to methods of preparing structures of alternating ultrathin semiconductor layers for the application of selective electrical contacts.

3. Description of Related Art

The field of photonics combines laser physics, electro-optics, and nonlinear optics. An example of a photonic system is found in lightwave communications, where optical signals are generated, modulated, transmitted, and detected before they are changed into electrical form for ultimate use. Information processing provides another example of the application of photonics. There are several advantages of optical processing of information over electrical processing, which is limited in speed by pulse broadening in interconnected wires and in density by crosstalk between wires. Only the development of convenient digital optical logic elements with low switching energy prevents the realization of optical systems having the capacity to handle extremely large quantities of information.

An ideal material for electro-optic applications would be able to transform current into light and vice versa for emission and detection. This ideal material would also display large optical and electronic nonlinearities which would permit its utilization as an optical gate and transistor. The material could be used for optical modulation by exploiting both nonlinearities simultaneously.

The techniques of molecular beam epitaxy (MBE) and metal-organic vapor deposition make use of an ultraclean environment in combination with a slow growth rate to produce epitaxially grown materials. Junctions between different semiconductor materials (heterojunctions) can be made which are planar and atomically abrupt. Using growth rates as low as 1 Angstrom/second, it is possible to fabricate layered structures with layer thicknesses in the range from a few Angstroms to a few micrometers. Such multilayered structures display new properties not shown by the bulk semiconductor compounds.

Semiconductor structures consisting of stacks of ultrathin layers are called superlattices or quantum-well structures. There are an enormous number of potential applications in photonics for devices made from these structures. The compound III-V semiconductors, which are made from elements of Groups III and V of the periodic table, are well suited for the fabrication of quantum-well structures. In these materials the energy band gap is direct, which means that light can be emitted or absorbed without the aid of lattice vibrations, in a very efficient process. Charge carrier mobilities are very large in these materials, and they are easily doped with impurities. From the structural point of view, it is very important that these materials can form solid solutions of various proportions with identical crystal structures and well-matched lattice parameters, but with different energy bandgaps and indices of refraction.

"Doping superlattices" are obtained by periodically alternating n and p doping during the growth of an otherwise uniform semiconductor such as gallium arsenide (GaAs). Originally the fabrication of doping superlattices with intrinsic layers in between the doped layers gave rise to the designation of "n-i-p-i" crystals. Doping superlattices in semiconductors provide modulation of the energy bands characterized by peaks and valleys. Holes sit on top of the peaks and electrons sit in the valleys. Electrons and holes are effectively spatially separated and confined. Characteristic series of energy subbands are created. Quantization of the carrier motion in the direction perpendicular to the layers produces a set of discrete energy levels. The effective energy gap can be set between zero and the gap of the host material by appropriately choosing the doping concentrations and thicknesses of the constituent layers. Also, the energy gap can be tuned by injecting carriers electrically and optically. Doping superlattices exhibit a variety of interesting new properties, such as extremely long lifetimes for electron-hole recombination, tunable electron and hole conductivities, very large photoconductive response, tunable absorption, tunable luminescence, and tunable optical gain.

A basic discussion of the n-i-p-i structure is given in an article by Klaus Ploog and Gottfried H. Dohler, "Compositional and Doping Superlattices in III-V Semiconductors", *Advances In Physics*, Vol 32, No. 3, 1983, pages 285–359. This article presents a general discussion of n-i-p-i structures, as well as the spatial control of optical absorption by a voltage pattern applied to the n-i-p-i structure. Other applications, such as in photoconductors, photodiodes, ultrafast photodetectors, light emitting devices, and optical absorption modulators, are discussed in an article by Dohler, "The Potential of n-i-p-i Doping Superlattices For Novel Semiconductor Devices", *Superlattices and Microstructures*, Vol 1, No. 3, 1985, pages 279–287. A further expansion on n-i-p-i applications is provided in another article by Dohler, "Light Generation, Modulation, and Amplification by n-i-p-i Doping Superlattices", *Optical Engineering*, Vol 25, No. 2, February, 1986, pages 211–218.

A unique property of n-i-p-i crystals is the possibility of selectively applying separate contacts to the n and p layers in order to investigate the electro-optical properties of these structures. The fabrication of these so-called selective electrodes has been attempted in different ways, but without success at doping levels high enough (at least $5 \times 10^{18}$) to get sufficient energy band modulation.

Horikoshi and Ploog describe one attempt to fabricate selective n-i-p-i contacts in an article in Applied Physics A37, pp. 47–56, published in 1985. The method consists of providing $n^+$ and $p^+$ regions extending perpendicular to the layers on the two far edges and alloying small Sn and Sn/Zn balls to these regions to form the selective electrodes. Another attempt is described by Kuenzel et al. in Applied Physics Letters 38, at page 285, published in 1981. It makes use of evaporated and subsequently annealed Ni/Sn and Au/Zn contacts on etched n-i-p-i mesas, grown on undoped substrates. Neither of the techniques described above yields satisfactory results for GaAs n-i-p-i structures with doping levels greater than about $10^{17}$ cm$^{-3}$. At doping concentrations significantly above $10^{18}$ cm$^{-3}$ the contacts have turned out to be hardly selective at all in GaAs. The situation is even worse for n-i-p-i crystals made from lower bandgap material such as InGaAs.

An improved but more complicated method of making selective contacts is described by Doehler et al. in Applied Physics Letters 49, pp. 704–706, published in 1986. The method is restricted to n-i-p-i structures made by molecular beam epitaxy techniques. It makes use of atomic or molecular beams having different angles of incidence onto the substrate. The donor or acceptor beams are shadowed in certain parts of the regions where high-quality bulk material is growing. A silicon wafer with rectangular windows etched through it is placed on top of the GaAs wafer as a shadow mask. The mask is oriented such that the dopant beams are incident at equal angles with respect to the windows. When an np-n-p superlattice is being grown, on one side an n-i-n-i structure results and on the other a p-i-p-i structure. Due to the finite shadow width a laterally graded p-n junction barrier is grown in for each contact to its oppositely doped layer. Since practically no holes are present in the n-i-n-i regions, the only requirement for the metal contact to be applied to this structure is good ohmic behavior to n-type material. The corresponding requirement applies to the p-type metal contact. The disadvantages of this technique are that it requires special molecular beam epitaxy equipment, that it does not yield sharp boundaries at the contacts, and that it cannot be used for n-i-p-i structures made by liquid-phase epitaxy or metal-organic vapor deposition.

SUMMARY OF THE INVENTION

In view of the foregoing problems associated with the prior art, it is an object of the invention to furnish a method of electrochemically etching a digitate edge pattern on a structure of alternating ultrathin semiconductor layers, for allowing selective electrical contacts to be added separately to the p-type and n-type layers of n-i-p-i photonic devices.

It is another object of this invention to provide a novel and improved method for selectively etching p-type or n-type doped semiconductor material in the presence of the other type.

It is yet another object of the invention to provide a means of producing novel semiconductor devices, using selective etching of n-type or p-type semiconductors.

In the accomplishment of these and other objects of the invention, an electrochemical method is provided for selectively etching either n-type or p-type semiconductor material in the presence of the other type. A liquid electrolyte is prepared in which the etching reaction is based on hole transport. In selectively etching p-type material the holes are provided by the dopant concentration; the process is carried out in the dark to prevent etching of n-type material assisted by light-generated holes. Conversely, selective etching of n-type material is done in the presence of light and with p-type material effectively out of the current path. In a preferred embodiment of a method of selectively etching a doping superlattice n-i-p-i structure composed of p-type and n-type GaAs layers, $C_6H_2(OH)_2(SO_3Na)_2 \cdot H_2O$ is used as the electrolyte. The major reaction is

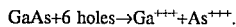

By selectively etching first the p-type layers at one end of the structure and then the n-type layers at the other end, digitate edge patterns are etched to which ohmic contacts can be applied. The invention also encompasses selectively etched structures which can be used to fabricate various kinds of electro-optic devices, such as optical modulators and photodetectors.

These and other features and advantages of the invention will be apparent to those skilled in the art from the following detailed description of preferred embodiments, taken together with the accompanying drawings, in which like reference numerals refer to like parts.

BRIEF DESCRIPTION OF THE DRAWINGS

FIG. 3 is a diagram of a setup for selectively etching p-type material from a semiconductor structure.

FIG. 4 is a diagram of a setup for selectively etching n-type material from a semiconductor structure.

DESCRIPTION OF THE PREFERRED EMBODIMENT

The invention uses an electrochemical reaction, not just a chemical reaction, to selectively etch GaAs n-i-p-i superlattice chips so that electrical contacts can be applied separately to the n-type layers and the p-type layers. This makes possible the exploitation of unusual electro-optic properties associated with these superlattice chips. An electrochemical etching reaction is used because the sign of the charge of the majority carriers is different in n-type and p-type GaAs. Since a special polarity of charge carrier is needed to dissolve a given type of material, selective etching of that material can be accomplished in the presence of the opposite type of doping.

Figure 1:
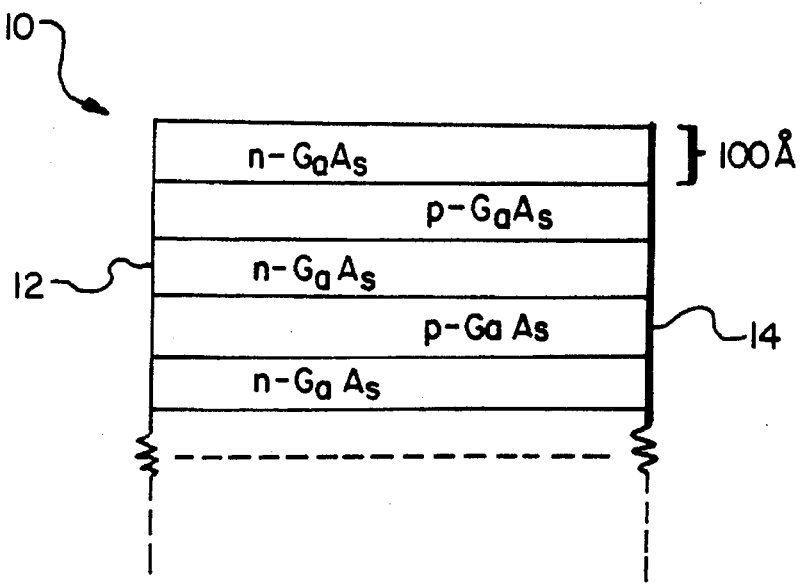
FIG. 1 is a sectional view showing a semiconductor structure of alternating n-doped and p-doped layers.

In FIG. 1 an n-i-p-i superlattice structure 10 is shown. Such a structure can be grown by molecular beam epitaxy using doped gallium arsenide, for example. The structure typically consists of about 500 alternating n-type layers 12 and p-type layers 14, each having a thickness of approximately 100 Angstroms.

Figure 2:
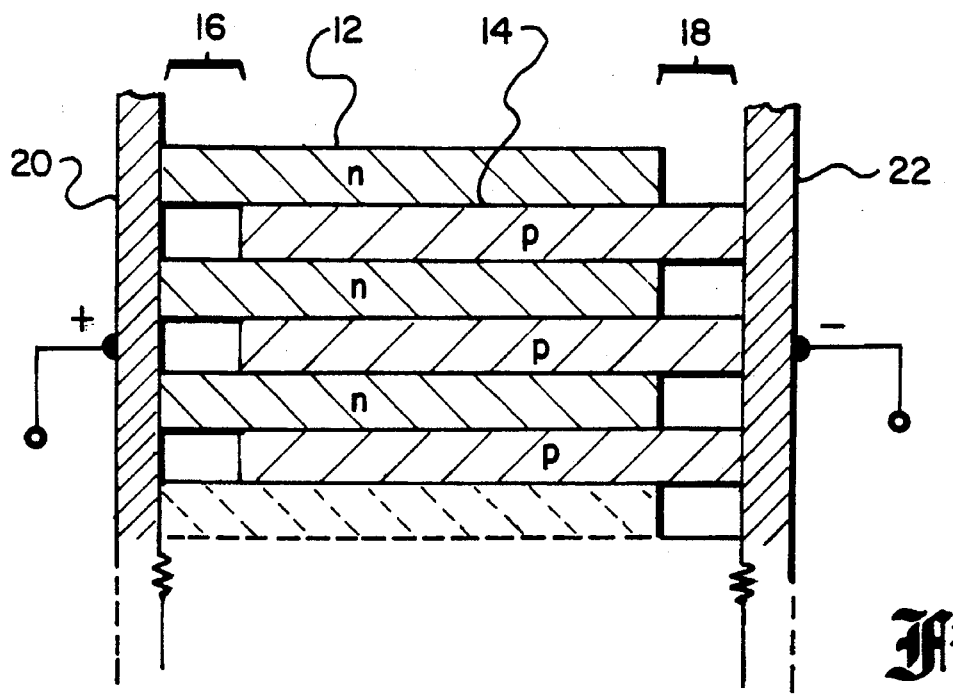
FIG. 2 shows the same structure as FIG. 1 after selective etching, so that selective contacts can be made.

FIG. 2 shows the desired type of digitate edge patterns 16 and 18 that result from selective etching. At the left side of the structure the p-type layers 14 have been etched away to form the digitate edge pattern 16, and at the right side of the structure the n-type 12 layers have been etched away to form the digitate edge pattern 18. Ohmic contact 20 can now be fabricated on the protruding n-type layers 12 of the edge pattern 16, and ohmic contact 22 on the protruding p-type layers 14 of the edge pattern 18.

In a preferred embodiment the process of forming the digitate edge patterns by selective electrochemical etching proceeds as follows. The first step is to remove p-type layers of material from one end of an n-i-p-i structure like the one shown in FIG. 1. The setup for doing this is shown in FIG. 3. A liquid electrolyte 24 is prepared in a container 25. An ohmic contact 26 is made on one end of the n-i-p-i structure 10 and the other end is immersed in the electrolyte 24. Because of the high doping levels in the n-i-p-i structure, the ohmic contact 26 can be Au or SnZn or Pt, for example. An electrode 28 is also immersed in the electrolyte 24 and a dc power supply 30 is connected across the ohmic contact 26 and the electrode 28, with 26 having positive polarity and 28 having negative polarity. The etching process is carried out in the absence of light because it is desired not to create any light-generated holes. The process is also carried out at not too high an ambient temperature, since it is desired not to have a significant number of holes generated thermally in the n-type material. Since relatively few holes are available in the n-type layers (typically $10^8$ cm$^{-3}$ at room temperature), the n-type material cannot participate appreciably in the electrolysis reaction and is not etched.

Preferably a 0.1M solution of dihydroxybenzene disulphonic disodium salt $C_6H_2(OH)_2(SO_3Na)_2 \cdot H_2O$ in distilled, deionized water is preferably used as the electrolyte 24. This compound is available under the trademark "Tiron". Other suitable electrolytes are a 0.5 M solution of hydrochloric acid (HCl) made with distilled, deionized water, or an ammonium tartrate ($(NH_4)_2C_4H_4O_6$) solution made by dissolving 110 grams of ammonium tartrate in 150 milliliters of distilled, deionized water. The major reaction during the etching process is

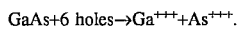

In n-type material holes are the minority carriers, so that without light-generated holes or a sufficient number of thermally generated holes the n-type layers cannot be dissolved and only the p-type layers will be etched.

In FIG. 4 the setup is shown for preferentially etching the edges of the n-type layers 12 at the other end of the n-i-p-i structure 10 after the preferential etching of the edges of the p-type layers 14 has taken place at the first end as described above. An ohmic contact 20 is first applied to the protruding n-type layers 12 of the digitate edge pattern 16. The ohmic contact 20 can be Au or SnZn or Pt, for example, because of the high doping level of the layers involved. After the ohmic contact 26 on the opposite end of the n-i-p-i structure 10 is removed by conventional etching, the end is immersed in the electrolyte 24 in container 25. The electrode 28 is also immersed in the electrolyte 24 and the dc power supply 30 is connected across the ohmic contact 20 and the electrode 28, with 20 having positive polarity and 28 having negative polarity. A light source 32, preferably a quartz-halogen lamp, illuminates the n-i-p-i structure 10 to generate holes in the n-type material to facilitate the etching reaction. Some holes will also be generated thermally in the n-type material and these will also take part in the etching reaction. Because the n-p junctions between the n-type layers and p-type layers are back-biased with approximately 3 to 5 Volts, effectively no current flows through the p-type layers and they are prevented from being etched.

The etching rate is controlled by the current density J during the electrolysis, and can be described by the etching depth W per second. The following equation can be used to calculate the etching rate:

$$\frac{W}{t} = \frac{MJ}{ZFD}$$

where t is time, M is the molecular weight of the material to be etched, D is the mass density of the material to be etched, F is Faraday's constant, and Z is the number of charge transfers for each dissolving molecule. For GaAs, D=5.36 g/cm$^3$, M=144.6 g/mole, and Z=6 (six holes needed to dissolve one GaAs molecule). Faraday's constant is 9.65×10$^4$ Coulombs/mole. Inserting these values in the above equation, the etching rate W/t is calculated to be 4.66×10$^3$J Angstrom cm$^2$/ Ampere sec. The etching current density can vary from 1 to 3 mA/cm$^2$ to give an etching rate of 4.7 to 14.0 Angstroms/sec.

The present invention has been described in detail with reference to a particular preferred embodiment, but persons possessing ordinary skill in the art to which this invention pertains will appreciate that various modifications may be made without departing from the spirit and scope of the invention.

What is claimed is:

1. A method of selectively etching a material of a certain conductivity type from a semiconductor structure having alternating n-type and p-type layers, said structure having two ends on opposite sides of the structure such that each end comprises at least one pair of alternating n-type and p-type layers, the method comprising the steps of:

a. preparing a liquid electrolyte;
   b. connecting an electrode to said liquid electrolyte;
   c. forming an ohmic contact across one end of said semiconductor structure;
   d. immersing the opposite end of said semiconductor structure in the liquid electrolyte; and
   e. applying a predetermined electric potential difference between said ohmic contact and said electrode connected to said liquid electrolyte, with a positive polarity being applied to said electrode for a time sufficient to selectively etch the layers of the material having that certain conductivity-type.

2. The method of claim 1 wherein the layers to be etched have an n-type conductivity and wherein the electric potential difference is applied in the presence of light.

3. The method of claim 1 wherein the layers to be etched have a p-type conductivity and wherein the electric potential difference is applied in the absence of light.

4. The method of claim 1 wherein the layers of the semiconductor structure are comprised of gallium arsenide.

5. The method of claim 2 wherein the layers of the semiconductor structure are comprised of gallium arsenide.

6. The method of claim 3 wherein the layers of the semiconductor structure are comprised of gallium arsenide.

7. The method of claim 5 wherein the liquid electrolyte comprises a solution of dihydroxybenzene disulphonic disodium salt.

8. The method of claim 6 wherein the liquid electrolyte comprises a solution of dihydroxybenzene disulphonic disodium salt.

9. The method of claim 5 wherein the liquid electrolyte comprises a solution of ammonium tartrate.

10. The method of claim 6 wherein the liquid electrolyte comprises a solution of ammonium tartrate.

11. The method of claim 5 wherein the liquid electrolyte comprises a solution of hydrochloric acid diluted with distilled, deionized water.

12. The method of claim 6 wherein the liquid electrolyte comprises a solution of hydrochloric acid diluted with distilled, deionized water.

13. A method of selectively etching p-doped and n-doped material from a n-i-p-i structure having alternating n-type and p-type layers, said structure having two ends on opposite sides of the semiconductor structure such that each end comprises at least one pair of alternating n-type and p-type layers, the method comprising the steps of:

a. preparing a liquid electrolyte;
   b. connecting an electrode to said liquid electrolyte;
   c. forming a first ohmic contact across one end of said semiconductor structure;
   d. immersing the opposite end of said semiconductor structure in the liquid electrolyte;
   e. applying a predetermined electric potential difference between said first ohmic contact and said electrode connected to said liquid electrolyte in the absence of light, with a positive polarity being applied to said electrode, for a time sufficient to selectively etch the p-doped layers to form digitate edge patterns;

f. removing the semiconductor structure from within the liquid electrolyte;

g. removing said first ohmic contact from said one end of the semiconductor structure;

h. forming a second ohmic contact across the opposite end of the semiconductor structure;

i. immersing the one end of said semiconductor structure in said liquid electrolyte; and j. applying a predetermined electric potential difference between said second ohmic contact and said electrode connected to said liquid electrolyte, in the presence of light, with a positive polarity applied to said electrode for a time sufficient to selectively etch the edges of the n-doped layers to form digitate edge patterns.

14. The method of claim 13 wherein the layers of the semiconductor structure are comprised of gallium arsenide.

15. The method of claim 14 wherein the liquid electrolyte comprises a solution of dihydroxybenzene disulphonic disodium salt.

16. The method of claim 14 wherein the liquid electrolyte comprises a solution of ammonium tartrate.

17. The method of claim 14 wherein the liquid electrolyte comprises a solution of hydrochloric acid diluted with distilled, deionized water.

* * * * *